(12) United States Patent
Lin et al.

(10) Patent No.: US 11,437,325 B2
(45) Date of Patent: Sep. 6, 2022

(54) ELECTRONIC DEVICE, ELECTRONIC PACKAGE AND PACKAGING SUBSTRATE THEREOF

(71) Applicant: SILICONWARE PRECISION INDUSTRIES CO., LTD., Taichung (TW)

(72) Inventors: Ho-Chuan Lin, Taichung (TW); Hsiu-Fang Chien, Taichung (TW); Chih-Yuan Shih, Taichung (TW); Tsung-Li Lin, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 0 days.

(21) Appl. No.: 16/943,344

(22) Filed: Jul. 30, 2020

(65) Prior Publication Data
US 2021/0358851 A1 Nov. 18, 2021

(30) Foreign Application Priority Data
May 18, 2020 (TW) ................................ 109116406

(51) Int. Cl.
*H01L 23/538* (2006.01)
*H01L 23/528* (2006.01)
*H01L 23/00* (2006.01)

(52) U.S. Cl.
CPC ...... *H01L 23/5386* (2013.01); *H01L 23/5286* (2013.01); *H01L 23/5385* (2013.01); *H01L 24/09* (2013.01); *H01L 24/14* (2013.01)

(58) Field of Classification Search
None
See application file for complete search history.

(56) References Cited

U.S. PATENT DOCUMENTS

| | | | | |
|---|---|---|---|---|
| 4,034,399 A * | 7/1977 | Drukier | .................. | H01L 23/50 257/275 |
| 4,577,214 A * | 3/1986 | Schaper | ................ | H01L 23/495 257/665 |
| 5,283,717 A * | 2/1994 | Hundt | ............... | H01L 23/49503 361/813 |
| 5,639,989 A * | 6/1997 | Higgins, III | ........... | H05K 3/284 174/386 |
| 6,064,113 A * | 5/2000 | Kirkman | ........... | H01L 23/49827 257/691 |
| 6,278,264 B1 * | 8/2001 | Burstein | ........... | H01L 23/49844 323/282 |
| 6,462,522 B2 * | 10/2002 | Burstein | ........... | H01L 23/49844 323/282 |
| 6,465,278 B2 * | 10/2002 | Russell | ............... | H01L 23/4951 257/666 |
| 6,787,920 B2 * | 9/2004 | Amir | ................... | H01L 23/5386 257/778 |
| 7,019,362 B2 * | 3/2006 | Sakamoto | ........... | H01L 29/0692 257/341 |

(Continued)

*Primary Examiner* — Bo B Jang
(74) *Attorney, Agent, or Firm* — Kelly & Kelley, LLP

(57) ABSTRACT

An electronic package is provided and has a packaging substrate including a ground pad and a power pad. The power pad surrounds at least three directions of the ground pad so as to increase the footprint of the power pad on the packaging substrate, thereby avoiding cracking of an electronic element disposed on the packaging substrate and effectively reducing the voltage drop.

18 Claims, 6 Drawing Sheets

(56) References Cited

U.S. PATENT DOCUMENTS

| | | | | |
|---|---|---|---|---|
| 7,183,658 B2* | 2/2007 | Towle | H01L 23/49838 | 257/784 |
| 7,348,680 B2* | 3/2008 | Rotaru | H01L 23/3107 | 257/728 |
| 7,382,629 B2* | 6/2008 | Hsu | H05K 1/115 | 174/255 |
| 7,755,174 B2* | 7/2010 | Rollin | H05K 1/0224 | 257/664 |
| 7,872,350 B2* | 1/2011 | Otremba | H01L 21/4832 | 257/723 |
| 8,289,727 B2* | 10/2012 | Lin | H01L 23/49838 | 361/783 |
| 9,147,643 B2* | 9/2015 | You | H01L 23/5386 | |
| 9,318,434 B2* | 4/2016 | Matsui | H01L 23/528 | |
| 9,609,749 B2* | 3/2017 | Chang | H01L 23/50 | |
| 9,881,881 B2* | 1/2018 | Brindle | H01L 23/60 | |
| 9,883,591 B2* | 1/2018 | Chang | H01L 23/49827 | |
| 9,966,652 B2* | 5/2018 | Mangrum | H01Q 9/0407 | |
| 10,032,845 B2* | 7/2018 | Song | H01L 27/3248 | |
| 10,103,135 B2* | 10/2018 | Zuo | H03H 7/0115 | |
| 10,194,530 B2* | 1/2019 | Chang | H01L 23/49816 | |
| 10,340,199 B2* | 7/2019 | Hsu | H01L 23/3677 | |
| 10,454,163 B2* | 10/2019 | Lee | H01Q 1/48 | |
| 10,559,528 B2* | 2/2020 | Nagasato | H03K 17/6871 | |
| 10,566,680 B2* | 2/2020 | Mangrum | H01L 23/66 | |
| 10,707,170 B2* | 7/2020 | Ebensperger | H01L 23/5386 | |
| 10,856,406 B2* | 12/2020 | Nagasato | H05K 1/0243 | |
| 10,923,800 B2* | 2/2021 | Mangrum | H01L 23/66 | |
| 2001/0005039 A1* | 6/2001 | Russell | H01L 24/06 | 257/666 |
| 2001/0035746 A1* | 11/2001 | Burstein | H01L 23/49844 | 323/283 |
| 2003/0045083 A1* | 3/2003 | Towle | H01L 23/5389 | 438/612 |
| 2003/0235044 A1* | 12/2003 | Amir | H01L 23/5386 | 361/767 |
| 2004/0227163 A1* | 11/2004 | Sakamoto | H01L 24/02 | 257/207 |
| 2006/0202337 A1* | 9/2006 | Rotaru | H01L 23/3107 | 257/754 |
| 2007/0017697 A1* | 1/2007 | Hsu | H05K 3/403 | 174/255 |
| 2008/0240656 A1* | 10/2008 | Rollin | H01L 23/373 | 385/50 |
| 2008/0251912 A1* | 10/2008 | Otremba | H01L 25/16 | 257/723 |
| 2011/0304998 A1* | 12/2011 | Lin | H05K 1/0253 | 361/783 |
| 2014/0319662 A1* | 10/2014 | You | H01L 23/49838 | 257/665 |
| 2015/0137260 A1* | 5/2015 | Matsui | H01L 27/088 | 257/390 |
| 2016/0143140 A1* | 5/2016 | Chang | H05K 1/05 | 174/262 |
| 2016/0148854 A1* | 5/2016 | Hsu | H01L 23/34 | 361/767 |
| 2016/0309592 A1* | 10/2016 | Nagasato | H05K 3/4685 | |
| 2017/0025368 A1* | 1/2017 | Brindle | H01L 23/5286 | |
| 2017/0125881 A1* | 5/2017 | Mangrum | H01Q 1/2283 | |
| 2017/0156208 A1* | 6/2017 | Chang | H05K 1/0298 | |
| 2017/0294500 A1* | 10/2017 | Song | H01L 27/3276 | |
| 2017/0332479 A1* | 11/2017 | Luo-Larson | H05K 1/144 | |
| 2018/0090475 A1* | 3/2018 | Zuo | H01L 23/552 | |
| 2018/0116051 A1* | 4/2018 | Chang | H05K 1/0262 | |
| 2018/0191055 A1* | 7/2018 | Mangrum | H01Q 9/0421 | |
| 2018/0247889 A1* | 8/2018 | Nagasato | H01L 24/06 | |
| 2018/0350762 A1* | 12/2018 | Gu | H01L 25/50 | |
| 2019/0097313 A1* | 3/2019 | Lee | H01Q 1/38 | |
| 2019/0333860 A1* | 10/2019 | Ebensperger | H01L 25/072 | |
| 2020/0153082 A1* | 5/2020 | Mangrum | H01Q 1/2283 | |
| 2021/0185799 A1* | 6/2021 | Hsieh | H05K 1/181 | |

* cited by examiner

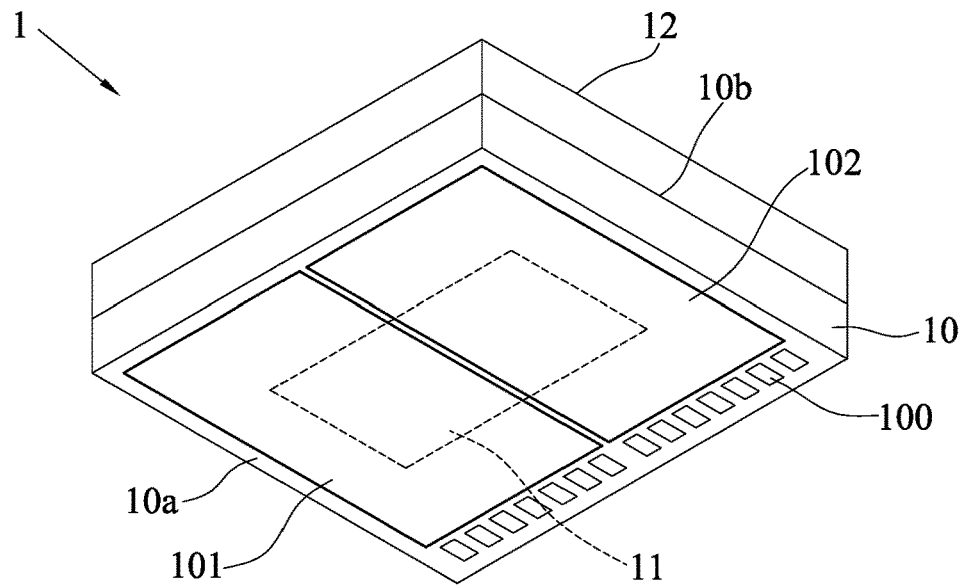
FIG. 1' (PRIOR ART)
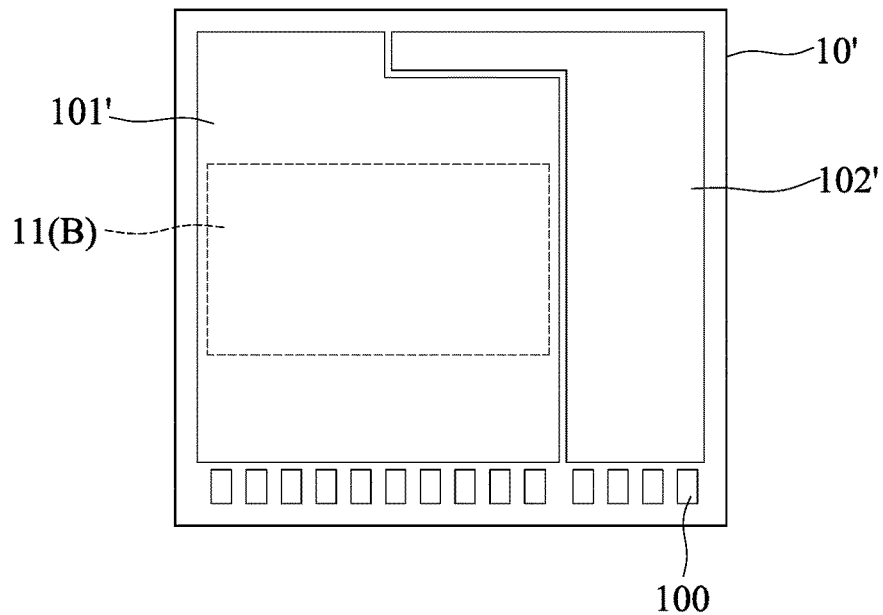
FIG. 1" (PRIOR ART)

ELECTRONIC DEVICE, ELECTRONIC PACKAGE AND PACKAGING SUBSTRATE THEREOF

CROSS-REFERENCE TO RELATED APPLICATIONS

This application claims priority to Taiwan Application Serial No. 109116406, filed on May 18, 2020. The entirety of the above-mentioned patent application is hereby incorporated by reference herein and made a part of this specification.

BACKGROUND

1. Technical Field

The present disclosure relates to electronic devices, and more particularly, to an electronic device, an electronic package and a packaging substrate thereof for improving the voltage drop.

2. Description of Related Art

Current chip packaging processes for digital currencies such as bitcoins use flip chip land grid array (FCLGA) packaging processes. Chips used in the FCLGA packaging processes need to meet the specifications of low voltage such as 0.3V to 0.5V and high current consumption such as 20 A to 50 A. Therefore, the voltage drop (IR drop) of a power system connected to the FCLGA packaging processes will affect the chip performance. For example, the greater the IR drop, the lower the chip performance will be.

FIGS. 1 and 1' are schematic views of a conventional FCLGA semiconductor package 1. As shown in FIGS. 1 and 1', a semiconductor chip 11 is flip-chip disposed on a chip mounting surface 10b of a packaging substrate 10 via a plurality of conductive bumps 110, and an encapsulant 12 is formed to encapsulate the semiconductor chip 11. A signal pad 100, a ground pad 101 and a power pad 102 are arranged on a lower surface 10a of the packaging substrate 10 for connecting onto a printed circuit board (not shown). As such, a power system can supply power from the power pad 102 to the semiconductor chip 11 through the printed circuit board.

However, as shown in FIGS. 1 and 1', a vertical projection area B of the semiconductor chip 11 towards the lower surface 10a of the packaging substrate 10 is correspondingly positioned in the ground pad 101 and the power pad 102. Therefore, the layout position of the semiconductor chip 11 is across the ground pad 101 and the power pad 102 concurrently. As such, during a thermal cycle of the packaging processes, the packaging substrate 10 is prone to deform due to the phenomenon of thermal expansion and contraction, thus leading to warping of the packaging substrate 10 and even causing cracking of the semiconductor chip 11.

Moreover, as shown in FIG. 1", the footprint of the ground pad 101' and the power pad 102' on the lower surface 10a of the packaging substrate 10' is changed. The footprint of the ground pad 101' on the lower surface 10a of the packaging substrate 10' is increased and the footprint of the power pad 102' on the lower surface 10a of the packaging substrate 10' is decreased. Therefore, the vertical projection area B of the semiconductor chip 11 towards the lower surface 10a of the packaging substrate 10' is correspondingly positioned in the ground pad 101' but not in the power pad 102', thus preventing the semiconductor chip 11 from cracking that otherwise may occur due to warping of the packaging substrate 10'. However, the reduced footprint of the power pad 102' on the lower surface 10a of the packaging substrate 10' greatly reduces the amount of current provided by the power pad 102' to the semiconductor chip 11 and hence greatly increases the voltage drop (IR drop) and adversely affects the performance of the semiconductor chip 11.

Therefore, how to overcome the above-described drawbacks of the prior art is becoming an urgent issue in the art.

SUMMARY

In view of the above-described drawbacks, the present disclosure provides a packaging substrate, which comprises: a substrate body having opposite first and second surfaces; a ground pad formed on the first surface of the substrate body; and a power pad formed on the first surface of the substrate body and surrounding at least three directions of the ground pad.

In the above-described packaging substrate, the power pad has a horseshoe shape or a U shape.

In the above-described packaging substrate, the second surface of the substrate body is defined with a chip mounting area. For example, the chip mounting area has a vertical projection area towards the first surface, and the vertical projection area is correspondingly positioned in the ground pad but not in the power pad. Further, the power pad surrounds the vertical projection area.

In the above-described packaging substrate, at least one of the first surface and the second surface of the substrate body is formed with at least one conductive pad thereon.

The present disclosure further provides an electronic package, which comprises: the above-described packaging substrate; and an electronic element disposed on the second surface of the packaging substrate and electrically connected to the ground pad and the power pad.

In the above-described electronic package, the electronic element has a vertical projection area towards the first surface, and the vertical projection area is correspondingly positioned in the ground pad but not in the power pad. For example, the power pad surrounds the vertical projection area.

In the above-described electronic package, the conductive pad is electrically connected to the electronic element.

The present disclosure further provides an electronic device, which comprises: a plurality of above-described packaging substrates; a first conductive wire electrically connecting the ground pad of each of the packaging substrates; and a second conductive wire electrically connecting the power pad of each of the packaging substrates.

The above-described electronic device can further comprise an electronic element disposed on the second surface of the substrate body and electrically connected to the power pad and the ground pad. For example, the electronic element has a vertical projection area towards the first surface, and the vertical projection area is correspondingly positioned in the ground pad but not in the power pad. Further, the power pad surrounds the vertical projection area.

In the above-described electronic device, at least one of the first surface and the second surface of the substrate body is formed with at least one conductive pad thereon, and the conductive pad is electrically connected to the electronic element.

According to the electronic device, the electronic package and the packaging substrate thereof of the present disclosure, the power pad surrounds at least three directions of the ground pad so as to increase the footprint of the power pad on the substrate body. Compared with the prior art, the present disclosure not only avoids cracking of the electronic element, but also effectively reduces the voltage drop.

BRIEF DESCRIPTION OF THE DRAWINGS

FIG. 1' is a schematic perspective view of FIG. 1;

FIG. 1" is a schematic plan view of a conventional packaging substrate;

FIG. 3' is a schematic partial plan view of FIG. 3.

DETAILED DESCRIPTION

The following illustrative embodiments are provided to illustrate the present disclosure, these and other advantages and effects can be apparent to those in the art after reading this specification.

It should be noted that all the drawings are not intended to limit the present disclosure. Various modifications and variations can be made without departing from the spirit of the present disclosure. Further, terms such as "first," "second," "on," "a," etc., are merely for illustrative purposes and should not be construed to limit the scope of the present disclosure.

Figure 2A:
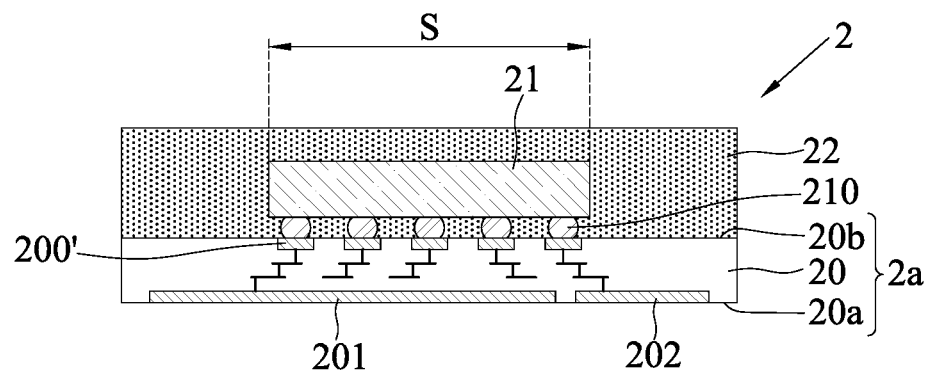
FIG. 2A is a schematic cross-sectional view of an electronic package according to the present disclosure.
Figure 2B:
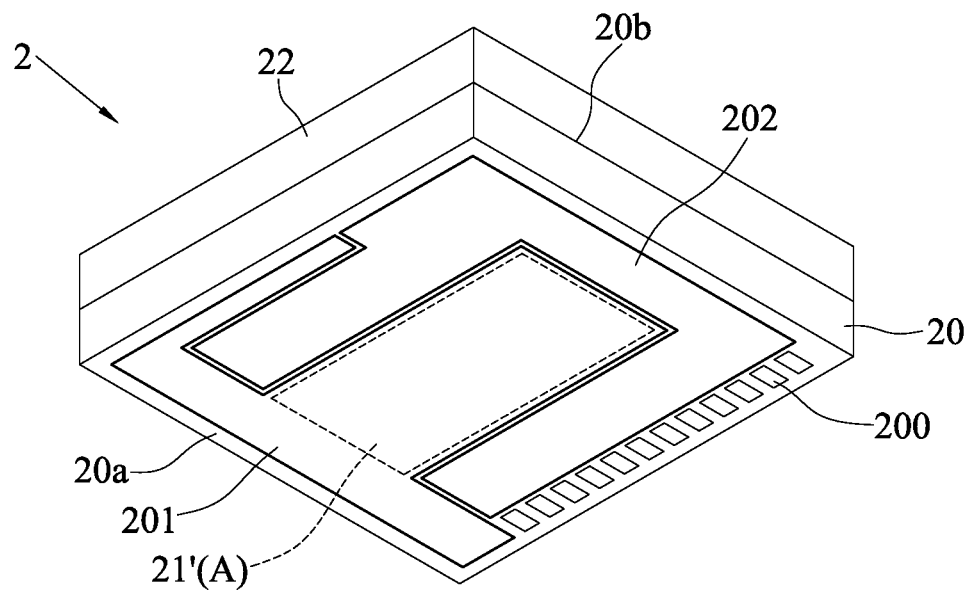
FIG. 2B is a schematic perspective view of FIG. 2A.
Figure 2C:
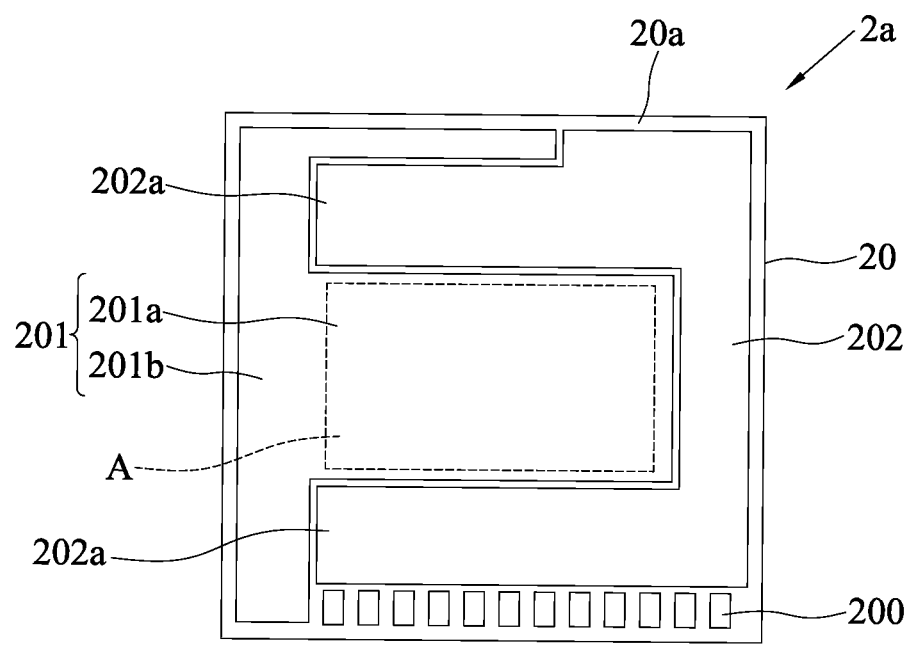
FIG. 2C is a schematic plan view of FIG. 2A.

FIGS. 2A to 2C are schematic views of an electronic package 2 according to the present disclosure. Referring to FIGS. 2A to 2C, the electronic package 2 includes: a packaging substrate 2a, an electronic element 21, and an encapsulant 22. The packaging substrate 2a has a substrate body 20, at least one ground pad 201 and at least one power pad 202.

Referring to FIG. 2B, the substrate body 20 is substantially of a rectangular shape and has a first surface 20a and a second surface 20b opposite to the first surface 20a.

In an embodiment, the substrate body 20 is a packaging substrate having a core layer and a circuit portion or a coreless circuit structure, which has at least an insulating layer and at least a circuit layer bonded to the insulating layer. For example, the circuit layer is a fan-out redistribution layer (RDL). The circuit layer includes the ground pad 201 and the power pad 202. Further, the circuit layer of the substrate body 20 has a plurality of first conductive pads 200 formed on the first surface 20a to serve as signal pads. Furthermore, referring to FIG. 2A, the circuit layer of the substrate body 20 can have a plurality of second conductive pads 200' formed on the second surface 20b (such as a chip mounting area S) to serve as bonding pads. In addition, the substrate body 20 can be other board for carrying a chip. For example, the substrate body 20 is a silicon interposer or other board with metal wiring (routing) thereon.

Further, the substrate body 20 can be fabricated through various fabrication processes. For example, the circuit layer is formed through a wafer process, and silicon nitride or silicon oxide is formed by chemical vapor deposition (CVD) as the insulating layer. Alternatively, the circuit layer can be formed through a common non-wafer fabrication process, and a low-cost polymer dielectric material such as polyimide (PI), polybenzoxazole (PBO), prepreg (PP), a molding compound, a photosensitive dielectric layer or the like is formed by coating as the insulating layer.

Further, referring to FIG. 2A, a chip mounting area S is defined on the second surface 20b of the substrate body 20. For example, the chip mounting area S is substantially of a rectangular shape, and a vertical projection area A of the chip mounting area S towards the first surface 20a of the substrate body 20 is correspondingly positioned in the ground pad 201 but not in the power pad 202. Referring to FIG. 2C, the power pad 202 surrounds three edges of the vertical projection area A.

Furthermore, referring to FIGS. 2B and 2C, the first conductive pads 200 are spacedly arranged along one of the edges of the first surface 20a of the substrate body 20.

The ground pad 201 is formed on the first surface 20a of the substrate body 20 and electrically connected to a second conductive pad 200'.

In an embodiment, referring to FIG. 2B, the ground pad 201 is substantially of a T shape or a deformation thereof. For example, the ground pad 201 is defined with a main pad portion 201a corresponding to the vertical projection area A and an external connecting portion 201b arranged along an edge of the first surface 20a of the substrate body 20. The main pad portion 201a is substantially of a rectangular shape and positioned in the middle of the first surface 20a of the substrate body 20, and the external connecting portion 201b is arranged along two adjacent edges of the first surface 20a of the substrate body 20 and has a crutch shape or an L shape, as shown in FIG. 2C.

The power pad 202 is formed on the first surface 20a of the substrate body 20, spacedly surrounds at least three directions of the ground pad 201 (main pad portion 201a), and is electrically connected to a second conductive pad 200'.

In an embodiment, referring to FIG. 2B, the power pad 202 has a horseshoe shape, a U shape or a deformation thereof. For example, the power pad 202 surrounds three edges of the main pad portion 201a of the ground pad 201. Referring to FIG. 2C, two end portions 202a of the power pad 202 are spaced from the external connecting portion 201b of the ground pad 201 so as to allow the shape of the power pad 202 and the shape of the ground pad 201 to be complementary to one another, thus maximizing the footprint of the power pad 202 and the ground pad 201 on the first surface 20a of the substrate body 20.

The electronic element 21 is disposed on the chip mounting area S of the second surface 20b of the packaging substrate 2a and electrically connected to the ground pad 201 and the power pad 202 through the second conductive pads 200'.

In an embodiment, the electronic element 21 is an active element such as a semiconductor chip, a passive element such as a resistor, a capacitor or an inductor, or a combination thereof. For example, the electronic element 21 is flip-chip disposed on the second surface 20b of the substrate body 20 and electrically connected to the second conductive pads 200' through a plurality of conductive bumps 210 made of such as a solder material, and an underfill (not shown) is formed to encapsulate the conductive bumps 210. In another embodiment, the electronic element 21 can be electrically connected to the second conductive pads 200' through a plurality of bonding wires such as gold wires (not shown) in a wire-bonding manner. In a further embodiment, the electronic element 21 can be in direct contact with the second conductive pads 200' so as to be electrically connected to the second conductive pads 200'. But it should be noted that the electrical connection between the electronic element 21 and the circuit layer is not limited to the above-described examples.

Further, the electronic element 21 is substantially of a rectangular shape. A vertical projection area 21' of the electronic element 21 towards the first surface 20a of the substrate body 20 is corresponding positioned in the ground pad 201 but not in the power pad 202. For example, the power pad 202 surrounds the vertical projection area 21' of the electronic element 21. The area of the main pad portion 201a of the ground pad 201 is greater than or equal to the area of the vertical projection area 21' of the electronic element 21 towards the first surface 20a.

The encapsulant 22 is formed on the second surface 20b of the packaging substrate 2a for encapsulating the electronic element 21 and the conductive bumps 210.

In an embodiment, the encapsulant 22 is made of an insulating material such as polyimide, a dry film, an epoxy resin or a molding compound. For example, the encapsulant 22 is formed on the substrate body 20 by using a liquid compound, injection, lamination or compression molding. The production line specification of FCLGA packaging processes is used to package the packaging substrate 2a, the electronic element 21 and the encapsulant 22 for forming the electronic package 2.

Therefore, in the electronic package 2 or packaging substrate 2a, the power pad 202 surrounds at least three directions of the ground pad 201 so as to increase the footprint of the power pad 202 on the first surface 20a of the substrate body 20, thereby greatly increasing the amount of current provided by the power pad 202 to the electronic element 21 and shortening the power supply path. Compared with the prior art, the electronic package 2 or packaging substrate 2a of the present disclosure can effectively reduce the voltage drop (IR drop). Referring to the following table, the overall voltage drop of the electronic package 2 or packaging substrate 2a of the present disclosure has been improved by 60% compared with the prior art (i.e., 0.39 times the prior art), wherein the overall voltage drop of the packaging substrate 10 of FIG. 1' is used as a reference X and X=13.98.

Figure 1:
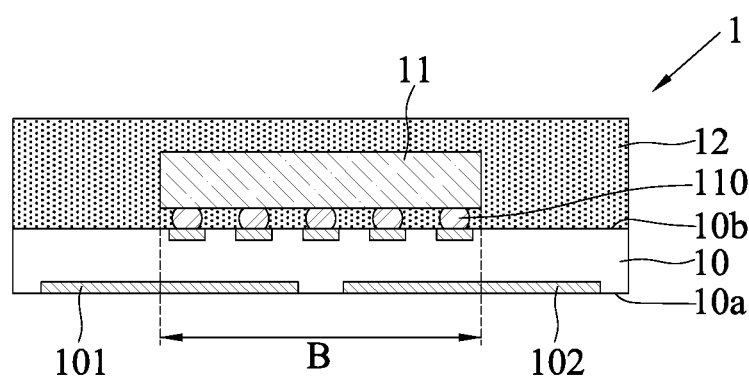
FIG. 1 is a schematic cross-sectional view of a conventional semiconductor package.

| | FIG. 1' | FIG. 1" | The present disclosure |
|---|---|---|---|
| Power signal (VDD) voltage drop (mV) | 5.18 | 13.42 | 5.02 |
| Ground signal (VSS) voltage drop (mV) | 8.8 | 0.41 | 0.4 |
| Overall voltage drop | 13.98 | 13.83 | 5.42 |
| Ratio | X | 0.99X | 0.39X |

Further, since the power pad 202 surrounds at least three directions of the ground pad 201, the electronic package 2 or packaging substrate 2a can provide power to the electronic element 21 in multiple directions.

Furthermore, the vertical projection area 21' of the electronic element 21 towards the first surface 20a of the substrate body 20 is not positioned in the power pad 202. Therefore, the electronic element 21 is not across the ground pad 201 and the power pad 202. Compared with the prior art, the electronic element 21 of the electronic package 2 of the present disclosure will not crack due to warping of the packaging substrate 2a.

Figure 3:
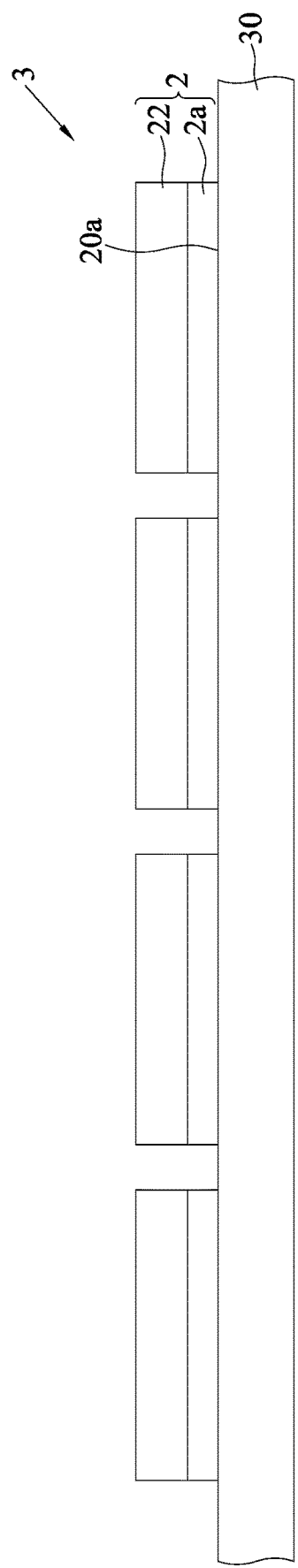
FIG. 3 is a schematic side view of an electronic device according to the present disclosure.
Figure 3:
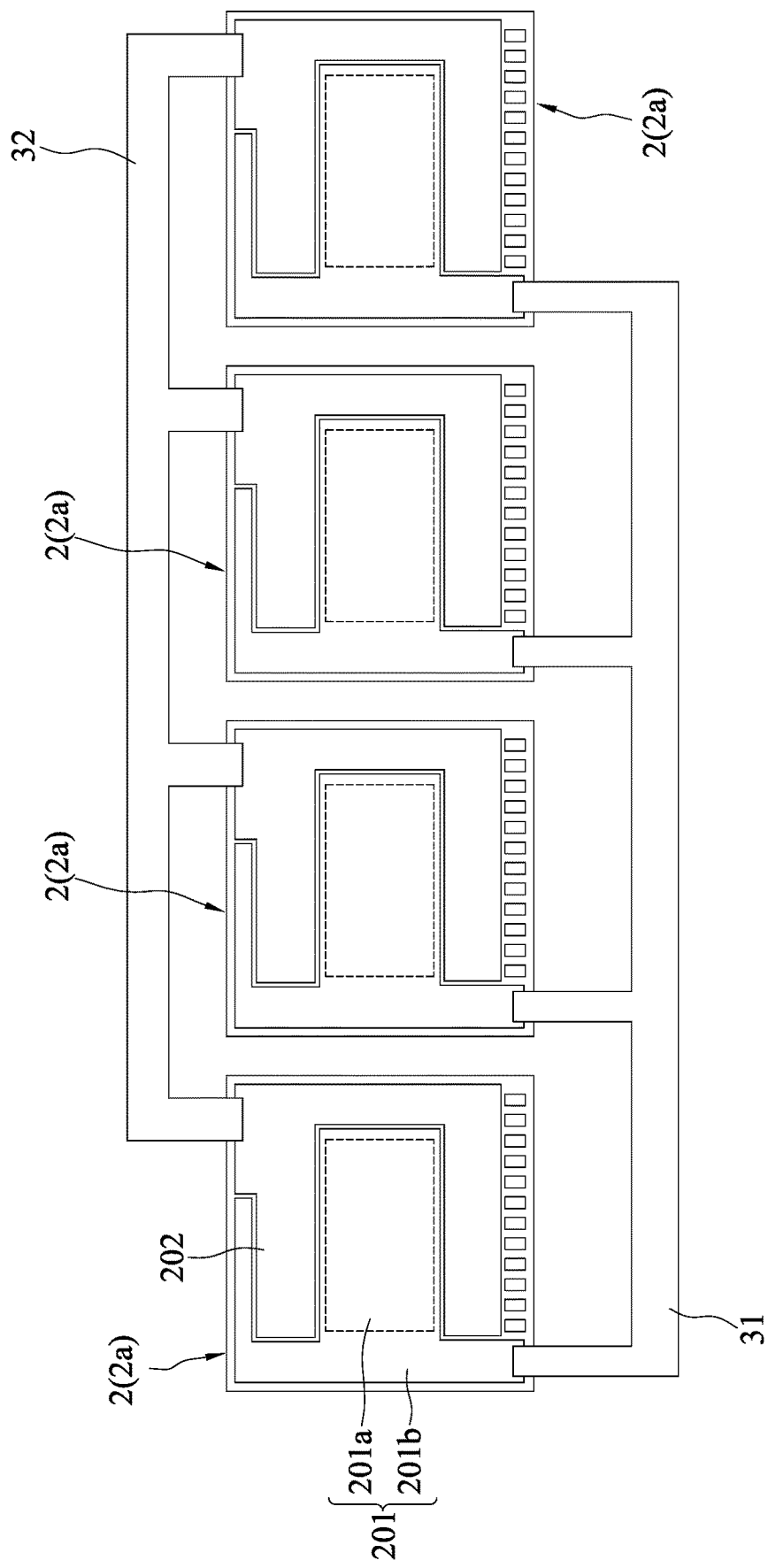

In addition, referring to FIGS. 3 and 3', in subsequent applications, a plurality of packaging substrates 2a or electronic packages 2 can be connected in series onto a printed circuit board (PCB) 30 so as to form an electronic device 3. The electronic device 3 can further be used in virtual currencies such as bitcoins.

In an embodiment, the packaging substrates 2a or electronic packages 2 are disposed on the printed circuit board 30 via the first surfaces 20a thereof. The electronic device 3 has a first conductive wire 31 electrically connecting to each ground pad 201 and a second conductive wire 32 electrically connecting to each power pad 202. For example, the first conductive wire 31 and the second conductive wire 32 are a surface wiring layer of the printed circuit board 30. Alternatively, the first conductive wire 31 and the second conductive wire 32 can be electrical wires that soldered to contacts of the printed circuit board 30. The first conductive wire 31 connects the external connecting portions 201b of the ground pads 201 in series and the second conductive wire 32 connects the power pads 202 in series.

Therefore, in the electronic device 3 of the present disclosure, since the power pad 202 surrounds at least three directions of the ground pad 201, the printed circuit board 30 or a power system (not shown) can provide power to the electronic elements 21 in multiple directions.

According to the electronic device, the electronic package and the packaging substrate thereof of the present disclosure, the power pad surrounds at least three directions of the ground pad so as to increase the footprint of the power pad on the substrate body. Compared with the prior art, the present disclosure can not only avoid cracking of the electronic element, but also effectively reduce the voltage drop, thereby greatly improving the reliability of the electronic element.

The above-described descriptions of the detailed embodiments are to illustrate the implementation according to the present disclosure, and it is not to limit the scope of the present disclosure. Accordingly, all modifications and variations completed by those with ordinary skill in the art should fall within the scope of present disclosure defined by the appended claims.

What is claimed is:

1. A packaging substrate, comprising:
   a substrate body having opposite first and second surfaces, wherein the second surface of the substrate body is defined with a chip mounting area, and wherein the chip mounting area has a vertical projection area towards the first surface;
   a ground pad formed on the first surface of the substrate body; and
   a power pad formed on the first surface of the substrate body and surrounding at least three directions of the ground pad, wherein the ground pad is free from surrounding all side surfaces of the power pad, and wherein the vertical projection area is correspondingly positioned in the ground pad but not in the power pad.

2. The packaging substrate of claim 1, wherein the power pad has a horseshoe shape or a U shape.

3. The packaging substrate of claim 1, wherein the power pad surrounds the vertical projection area.

4. The packaging substrate of claim 1, wherein at least one of the first surface and the second surface of the substrate body is formed with at least one signal pad thereon.

5. An electronic package, comprising:
   the packaging substrate of claim 1; and
   an electronic element disposed on the second surface of the substrate body and electrically connected to the ground pad and the power pad.

6. The electronic package of claim 5, wherein the electronic element has a vertical projection area of the electronic element towards the first surface, and the vertical projection area is correspondingly positioned in the ground pad but not in the power pad.

7. The electronic package of claim 6, wherein the power pad surrounds the vertical projection area of the electronic element.

8. The electronic package of claim 5, wherein at least one of the first surface and the second surface of the substrate body is formed with at least one conductive pad thereon, and the conductive pad is electrically connected to the electronic element.

9. An electronic device, comprising:
a plurality of packaging substrates, each comprising;
a substrate body having opposite first and second surfaces;
a ground pad formed on the first surface of the substrate body; and
a power pad formed on the first surface of the substrate body and surrounding at least three directions of the ground pad, wherein the ground pad is free from surrounding all side surfaces of the power pad;
a first conductive wire electrically connecting the ground pad of each of the packaging substrates; and
a second conductive wire electrically connecting the power pad of each of the packaging substrates.

10. The electronic device of claim 9, wherein the power pad has a horseshoe shape or a U shape.

11. The electronic device of claim 9, wherein the second surface of the substrate body is defined with a chip mounting area.

12. The electronic device of claim 11, wherein the chip mounting area has a vertical projection area towards the first surface, and the vertical projection area is correspondingly positioned in the ground pad but not in the power pad.

13. The electronic device of claim 12, wherein the power pad surrounds the vertical projection area.

14. The electronic device of claim 9, wherein at least one of the first surface and the second surface of the substrate body is formed with at least one signal pad thereon.

15. The electronic device of claim 9, further comprising an electronic element disposed on the second surface of the substrate body and electrically connected to the power pad and the ground pad.

16. The electronic device of claim 15, wherein the electronic element has a vertical projection area towards the first surface, and the vertical projection area is correspondingly positioned in the ground pad but not in the power pad.

17. The electronic device of claim 16, wherein the power pad surrounds the vertical projection area.

18. The electronic device of claim 15, wherein at least one of the first surface and the second surface of the substrate body is formed with at least one conductive pad thereon, and the conductive pad is electrically connected to the electronic element.

* * * * *